United States Patent
Ha et al.

(10) Patent No.: US 8,642,383 B2
(45) Date of Patent: Feb. 4, 2014

(54) DUAL-DIE PACKAGE STRUCTURE HAVING DIES EXTERNALLY AND SIMULTANEOUSLY CONNECTED VIA BUMP ELECTRODES AND BOND WIRES

(75) Inventors: Jong-Woo Ha, Seoul (KR); BumJoon Hong, Seoul (KR)

(73) Assignee: Stats Chippac Ltd., Singapore (SG)

( * ) Notice: Subject to any disclaimer, the term of this patent is extended or adjusted under 35 U.S.C. 154(b) by 1467 days.

(21) Appl. No.: 11/536,502

(22) Filed: Sep. 28, 2006

(65) Prior Publication Data

US 2008/0079130 A1    Apr. 3, 2008

(51) Int. Cl.
*H01L 25/11* (2006.01)

(52) U.S. Cl.
USPC .................. 438/109; 257/E25.027

(58) Field of Classification Search
USPC ........... 257/777, E25.006, E25.013, E25.018, 257/E25.021, E25.027; 438/109
See application file for complete search history.

(56) References Cited

U.S. PATENT DOCUMENTS

| | | | |
|---|---|---|---|
| 5,594,275 A | 1/1997 | Kwon et al. | |
| 5,757,080 A | 5/1998 | Sota | |
| 6,239,367 B1 | 5/2001 | Hsuan et al. | |
| 6,476,474 B1 | 11/2002 | Hung | |
| 6,590,281 B2 | 7/2003 | Wu et al. | |
| 6,677,674 B2 * | 1/2004 | Nagao | 257/724 |
| 6,724,074 B2 | 4/2004 | Song et al. | |
| 6,759,737 B2 | 7/2004 | Seo et al. | |
| 6,764,880 B2 | 7/2004 | Wu et al. | |
| 6,984,881 B2 | 1/2006 | Takiar | |
| 7,045,396 B2 | 5/2006 | Crowley et al. | |
| 7,078,794 B2 | 7/2006 | Lee | |
| 7,138,704 B2 | 11/2006 | Lien et al. | |
| 7,145,247 B2 | 12/2006 | Kawano et al. | |
| 7,622,333 B2 | 11/2009 | Kim et al. | |
| 7,645,638 B2 | 1/2010 | Kim et al. | |
| 7,683,467 B2 | 3/2010 | Jang et al. | |
| 2003/0057539 A1 | 3/2003 | Koopmans | |
| 2003/0209740 A1 | 11/2003 | Miyamoto et al. | |
| 2004/0021230 A1 * | 2/2004 | Tsai et al. | 257/777 |
| 2004/0124539 A1 | 7/2004 | Yang et al. | |
| 2005/0156290 A1 | 7/2005 | Lien et al. | |
| 2005/0189623 A1 * | 9/2005 | Akram et al. | 257/659 |
| 2006/0249851 A1 | 11/2006 | Karnezos | |
| 2008/0029868 A1 | 2/2008 | Lee et al. | |

(Continued)

FOREIGN PATENT DOCUMENTS

| JP | 2001177005 | 6/2001 |
|---|---|---|
| JP | 2001274316 | 10/2001 |

(Continued)

OTHER PUBLICATIONS

Office Action from JP Application No. 251743/2007 dated Aug. 21, 2012.

(Continued)

*Primary Examiner* — Marcos D. Pizarro
(74) *Attorney, Agent, or Firm* — Ishimaru & Associates LLP

(57) ABSTRACT

An integrated circuit package system that includes: providing an electrical interconnect system including a first lead-finger system and a second lead-finger system; connecting a first device to the first lead-finger system with a wire bond; stacking a second device over the first device; and connecting the second device to the second lead-finger system with a bump bond.

5 Claims, 4 Drawing Sheets

(56) References Cited

U.S. PATENT DOCUMENTS

| | | |
|---|---|---|
| 2008/0029905 A1 | 2/2008 | Merilo et al. |
| 2008/0136005 A1 | 6/2008 | Lee et al. |
| 2008/0136006 A1 | 6/2008 | Jang et al. |
| 2008/0136007 A1 | 6/2008 | Kim et al. |

FOREIGN PATENT DOCUMENTS

| | | |
|---|---|---|
| JP | 2002359345 | 12/2002 |
| JP | 2003068975 | 3/2003 |
| JP | 2004153220 A | 5/2004 |
| JP | 2006310649 | 11/2006 |
| TW | 544901 B | 8/2003 |

OTHER PUBLICATIONS

Office Action/Examination Report dated Apr. 17, 2013 for TW Application No. 096135868.

Office Action dated Aug. 27, 2013 for JP Application No. 251743/2007.

* cited by examiner

DUAL-DIE PACKAGE STRUCTURE HAVING DIES EXTERNALLY AND SIMULTANEOUSLY CONNECTED VIA BUMP ELECTRODES AND BOND WIRES

CROSS-REFERENCE TO RELATED APPLICATION(S)

The present application contains subject matter related to co-pending U.S. patent application Ser. No. 11/462,568. The related application is assigned to STATS ChipPAC Ltd.

The present application contains subject matter related to co-pending U.S. patent application Ser. No. 11/462,588. The related application is assigned to STATS ChipPAC Ltd.

The present application contains subject matter related to co-pending U.S. patent application Ser. No. 11/462,607. The related application is assigned to STATS ChipPAC Ltd.

TECHNICAL FIELD

The present invention relates generally to integrated circuits, and more particularly to an integrated circuit package system employing bump technology.

BACKGROUND ART

Integrated circuits are what power many of today's consumer electronics, for instance, cellphones, video cameras, portable music players, computers, etc. The use of wafers is still the most cost-effective way to fabricate these integrated circuits. But, before these integrated circuits can be incorporated into today's consumer electronics, they must be separated from the wafer and assembled into final integrated circuit packages.

The assembly and packaging portion of the integrated circuit manufacturing process takes these separated integrated circuit devices, places them onto a leadframe, and interconnects the bonding pads of the integrated circuit to the leads of the leadframe via wire-bonding. This combination is then usually encapsulated by a resin compound to protect the integrated circuit package from various conditions, such as moisture, temperature, and mechanical vibration.

Unfortunately many integrated circuit package designs suffer from bulky configurations and poor heat dissipation. For example, wirebond interconnections formed between the bonding pads of the integrated circuit and the leads of the leadframe require a minimum spacing requirement that adds to the footprint of the integrated circuit package. Additionally, many packages suffer from poor thermal dissipation due to design configurations that do not permit thermal abatement. As the trend toward smaller consumer electronic devices continues, integrated circuit package designers will have to seek solutions to the decreasing size demands of the electronics industry. Packaging goals of smaller electronic devices will be met by decreasing the footprint area of a package while improving the thermal dissipation characteristics of the package.

Thus, a need still remains for an integrated circuit package system with a reduced footprint area and enhanced thermal dissipation characteristics. In view of the ever increasing commercial competitive pressures, increasing consumer expectations, and diminishing opportunities for meaningful product differentiation in the marketplace, it is increasingly critical that answers be found to these problems. Moreover, the ever-increasing need to save costs, improve efficiencies, and meet such competitive pressures adds even greater urgency to the critical necessity that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing an electrical interconnect system including a first lead-finger system and a second lead-finger system; connecting a first device to the first lead-finger system with a wire bond; stacking a second device over the first device; and connecting the second device to the second lead-finger system with a bump bond.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
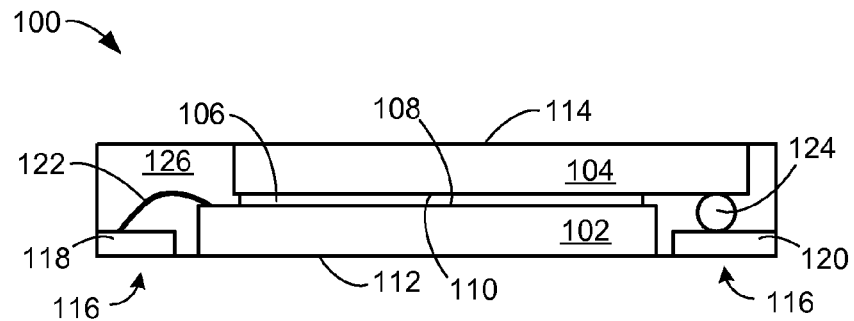
FIG. 1 is a cross sectional view of an integrated circuit package system, in accordance with an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown exaggerated in the drawing FIGs. Additionally, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional plane or surface of the integrated circuit package system, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1, therein is shown a cross sectional view of an integrated circuit package system 100, in accordance with an embodiment of the present invention. The integrated circuit package system 100 includes a first device 102, a second device 104, an inter-device structure 106, a first device active side 108, a second device active side 110, a first device backside 112, a second device backside 114, an electrical interconnect system 116, a first lead-finger system 118, a second lead-finger system 120, a wire bond 122, a bump bond 124, and an encapsulation material 126.

By way of example, the first device 102 and the second device 104 are stacked one over the other and may include semiconductor chips and integrated circuit packages selected from active components, passive components, stacked components, memory components, and so forth, in numerous configurations and arrangements as may be needed. It is to be understood that the first device 102 and the second device 104 cover a wide range of semiconductor chip and integrated circuit package configurations involving various sizes, dimensions, and electrical contact techniques, and the type of chip or package configuration employed should only be limited by the design specifications of the integrated circuit package.

Notably, the present invention allows for testing of the first device 102 and the second device 104 before adhering them to the electrical interconnect system 116, which may include the first lead-finger system 118 and the second lead-finger system 120, therefore ensuring the use of known good die or packages in the manufacturing process. Additionally, after adhering the first device 102 and the second device 104 to the electrical interconnect system 116, these assemblies can also be tested before incorporation into additional package systems. This ensures that the final product includes known good assemblies, and thereby improves the manufacturing process yield for packaging.

The first device 102 and the second device 104 are separated by the inter-device structure 106, or more specifically, the first device active side 108 and the second device active side 110 are separated by the inter-device structure 106. The inter-device structure 106 may include an adhesive with or without thermally conducting capabilities, a spacer, an electromagnetic interference shield for blocking potentially disruptive energy fields, or a combination thereof. For example, if the inter-device structure 106 is an adhesive layer, the adhesive layer may include a film or a partially unconsolidated (e.g.—a liquid or a gel) adhesive material, which allows the second device 104 to self-align. Furthermore, if the inter-device structure 106 is an adhesive layer, the adhesive layer can be deposited in any configuration or shape, which facilitates the adhesion of the second device 104.

Another notable aspect of the present invention is its improved thermal dissipation ability. The present invention achieves this by exposing the first device backside 112 and the second device backside 114 to the external environment, although it is to be understood that neither backside requires being exposed. This improved thermal dissipation ability can be further enhanced by forming a thermally conductive material or a heat sink over the first device backside 112 and/or the second device backside 114. Notably, by improving the ability of the integrated circuit package system 100 to dissipate heat, the reliability and the useful life of the integrated circuit package system 100 can be improved.

The electrical interconnect system 116 includes the first lead-finger system 118, which can be designed to accommodate bond wires, and the second lead-finger system 120, which can be designed to accommodate bump bonding technology. The first device 102 can have the first device active side 108 and the first device backside 112. Notably, the electrical interconnect system 116 does not include a paddle and is substantially coplanar with a side of the first device backside 112. By eliminating the need for a paddle and forming the electrical interconnect system 116 substantially coplanar with the first device backside 112, the profile of the integrated circuit package system 100 is greatly reduced.

The profile of the integrated circuit package system 100 can be even further reduced by employing thin and ultra-thin devices for the first device 102 and the second device 104. Through the use of thin and ultra-thin devices, the integrated circuit package system 100 may achieve a package height of about 0.20 mm or less. This reduced profile design of the integrated circuit package system 100 also naturally improves thermal dissipation because the heat flux of a solid object is inversely proportional to the thickness of the object, noting Fourier's law of heat conduction in solids.

By way of example, the electrical interconnect system 116 may include a thin metal sheet, a conductive plated pattern on plastic tape, or any structure suitable for electrically interconnecting the first device 102 and the second device 104 to external electrical circuits. By way of example, the electrical interconnect system 116 may include a structure with dual in-line leads, quad flat pack leads, gull-wing leads, j-leads, leadless leads that wrap around the package edge to maintain a low profile, downset leads, pin leads, and/or ball leads. However, it is to be understood that the present invention is not to be limited to these examples. In accordance with the invention, the electrical interconnect system 116 may include any electrical interconnection structure (i.e.—leads) that facilitates the incorporation of the integrated circuit package system 100 into a higher-level assembly, such as a printed circuit board or other suitable structure for supporting the integrated circuit package system 100.

The present invention incorporates a combination of wire bonding and bump bonding technology, to electrically interconnect the first device 102 and the second device 104 to the electrical interconnect system 116. For illustrative purposes, the first lead-finger system 118 is shown electrically connected to the first device 102 by the wire bond 122, and the second lead-finger system 120 is shown electrically connected to the second device 104 by the bump bond 124. The first lead-finger system 118 and the second lead-finger system 120 may be made from any number of materials that provide an electrically conductive and bondable surface for the wire bond 122 and the bump bond 124. For example, the first lead-finger system 118 and the second lead-finger system 120 may be made from a copper alloy or a nickel/palladium combination.

The present invention is able to employ both wire bonding and bump bonding technology by offsetting the second device 104 from the first device 102 such that the bonding pads on the first device active side 108 and the second device active side 110 are left exposed. By strategically offsetting the second device 104, the bonding pads located on the second device active side 110 can be aligned over the second lead-finger system 120 and bump bonding technology can be employed to electrically interconnect the second device 104 and the second lead-finger system 120.

The bump bond 124 of the present invention simplifies the manufacturing process by eliminating the steps of package inversion and tape removal that is required for conventional wire bonding of the second device 104 to the second lead-finger system 120. Additionally, by employing bump bonding technology, the present embodiment eliminates the minimum spacing requirement of wire bonding technology, thereby reducing the footprint of the integrated circuit package system 100. The concept of bump bonding technology reducing the footprint area of an integrated circuit package will be discussed in greater detail in FIG. 2.

It will be appreciated by those skilled in the art that the wire bond 122 and the bump bond 124 can be deposited using materials and techniques well known within the art and are not repeated herein.

The encapsulation material 126, such as a plastic molding compound, is deposited over the first device 102, the second device 104, the inter-device structure 106, the electrical interconnect system 116, the wire bond 122, and the bump bond 124, while leaving exposed the first device backside 112 and the second device backside 114 for thermal dissipation. The encapsulation material 126 not only protects the integrated circuit package system 100 from the external environment but it also provides support and stability. The encapsulation material 126 and molding techniques using it are well known in the art and not repeated herein.

Figure 2:
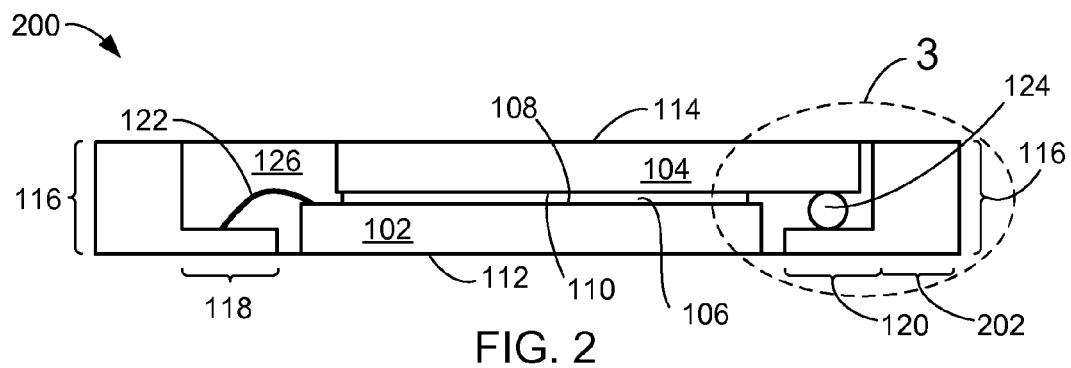
FIG. 2 is cross sectional view of an integrated circuit package system, in accordance with another embodiment of the present invention.

Referring now to FIG. 2. FIG. 2 depicts a similar configuration as to that shown in FIG. 1, and consequently, only the differences between the figures will be described, to avoid redundancy.

FIG. 2 shows a cross sectional view of an integrated circuit package system 200, in accordance with another embodiment of the present invention. The integrated circuit package system 200 includes the first device 102, the second device 104, the inter-device structure 106, the first device active side 108, the second device active side 110, the first device backside 112, the second device backside 114, the electrical interconnect system 116, the first lead-finger system 118, the second lead-finger system 120, the wire bond 122, the bump bond 124, and the encapsulation material 126. By way of example, the integrated circuit package system 200 may include a stackable integrated circuit package.

The additional versatility (i.e.—the stacking capability) offered by the integrated circuit package system 200 is afforded by the different structural design of the electrical interconnect system 116. The electrical interconnect system 116 still includes the first lead-finger system 118 and the second lead-finger system 120, but now additionally includes a stacking support system 202. The electrical interconnect system 116 of the integrated circuit package system 200 can be characterized as having an "L-shaped" configuration that can be formed by deep etching. By way of example, the deep etching process removes material from the electrical interconnect system 116, thereby forming the first lead-finger system 118 and the second lead-finger system 120.

Notably, the present embodiment employs bump bonding technology to interconnect the second device 104 to the second lead-finger system 120. By employing bump bonding technology, the present embodiment eliminates the minimum spacing requirement of wire bonding technology. The minimum spacing requirement of wire bonding technology is a value, which provides an acceptable distance between bonding pads of a device and bonding pads of a lead to enable the formation of a wire bond. For example, a wire bond lead that is substantially coplanar with and adjacent a device requires a minimum distance to enable a wire bond interconnection between the peripherally located bonding pads of the device and the lead. An exemplary minimum spacing or minimum distance requirement between the peripherally located bonding pads of the device and the lead can range from about two hundred (200) microns (when employing a die paddle with a fillet) to about one hundred (100) microns (when no die paddle is employed), per side of a device.

By contrast, the present invention is not limited by the minimum spacing/distance requirements of wire bonding technology. The bump bond 124 of the present invention allows the second lead-finger system 120 to be placed underneath the second device 104, instead of adjacent and substantially coplanar with the second device. By allowing the displacement of the second lead-finger system 120 under the second device 104, the width of the package is reduced and the overall footprint area of the package is reduced as well. This concept will be illustrated by FIG. 3 in greater detail.

Additionally, for even greater interconnect density, the present invention may employ single row, dual row and/or half-etched lands or leads. Furthermore, the integrated circuit package system 200 may include a thin package design, especially with thin or ultra-thin devices, having a package height of 0.20 mm.

Figure 3:
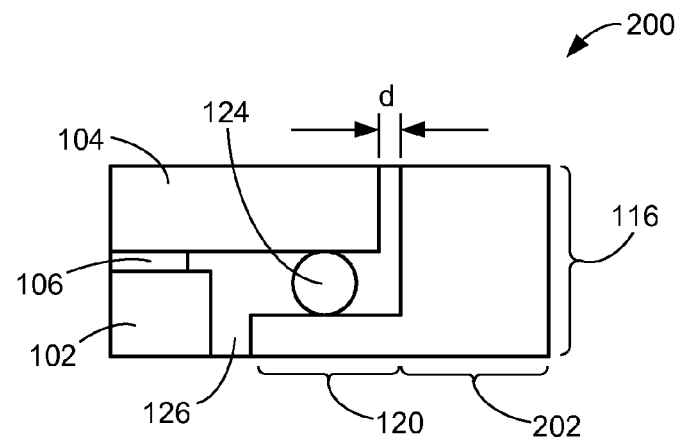
FIG. 3 is an enlarged view of the region within the dashed circle of FIG. 2, in accordance with an embodiment of the present invention.

Referring now to FIG. 3, therein is shown an enlarged view of the region within the dashed circle 3 of FIG. 2, in accordance with an embodiment of the present invention. The integrated circuit package system 200 includes the first device 102, the second device 104, the inter-device structure 106, the second lead-finger system 120, the bump bond 124, the encapsulation material 126, the stacking support system 202 and a bump bond/lead distance "d".

It has been discovered by the present inventors that by using bump bonding technology, the footprint area of the integrated circuit package system 100 and 200, of FIGS. 1 and 2, can be reduced. The footprint area of the integrated circuit package system 100 and 200 can be reduced because the distance between the electrical interconnect system 116 or the stacking support system 202 and the second device 104 is no longer limited by the minimum spacing/distance requirements of wire bond technology. It will be appreciated by those skilled in the art upon a reading of this disclosure, that the bump bond/lead distance "d", which is only limited by potential electromagnetic interference and/or its ability to fill with an encapsulant material, will be much smaller than the minimum spacing/distance requirements of wire bond technology. By way of example, the bump bond/lead distance "d" can be about ten (10) microns.

For purposes of further clarification, the following example is provided for illustrative purposes only. If we define a wire bond/lead distance "D" as the distance between a device and a lead due to wire bonding and the bump bond/lead distance "d" as the distance between the second device 104 and the electrical interconnect system 116 due to bump bonding, then "D" will be greater than "d" (D>d). More specifically, since a conventional wire bond/lead distance "D" is about 200 to about 100 microns and the bump bond/lead distance "d" is about 10 microns, then the width of the integrated circuit package system 100 and 200 can be reduced by about 190 to about 90 microns per side of a device. Consequently, since the present invention employs the bump bond/lead distance "d" (i.e.—the smaller gap technology), the footprint area of the present invention will be smaller than the footprint area of a conventional package system that only employs wire bonding technology.

Figure 4:
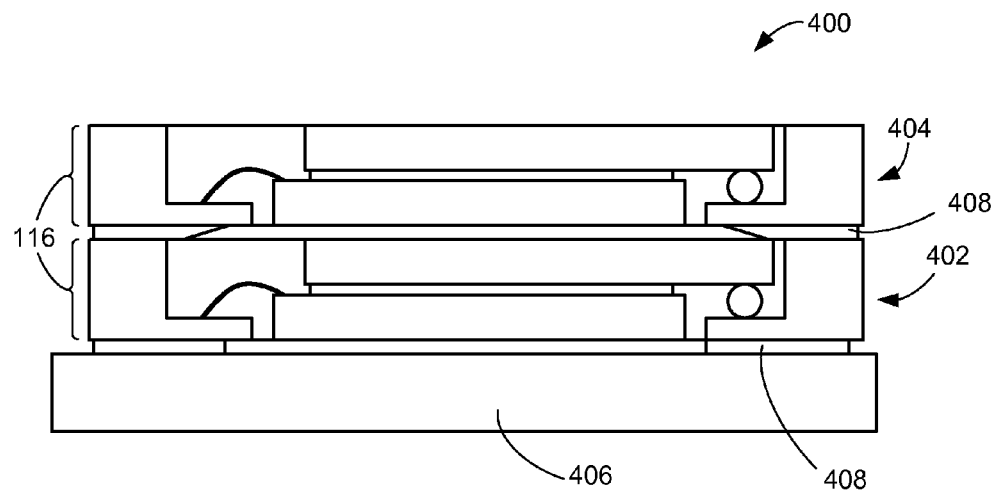
FIG. 4 is a cross-sectional view of an integrated circuit package-on-package system in accordance with another embodiment of the present invention.

Referring now to FIG. 4, therein is shown a cross-sectional view of an integrated circuit package-on-package system 400, in accordance with another embodiment of the present invention. The integrated circuit package-on-package system 400 includes a first package 402 stacked below a second package 404. The first package 402 and the second package 404 may be similar to or substantially the same as the integrated circuit package system 200, of FIG. 2.

The first package 402 is attached to a substrate 406, such as a printed circuit board, with a conductive material 408, such as a solder paste. More specifically, the conductive material 408 interconnects the first package to the substrate 406 through the electrical interconnect system 116. The second package 404 is stacked over the first package 402 with the electrical interconnect system 116 of the second package 404 connected to the electrical interconnect system 116 of the first package 402 via the conductive material 408.

The first package 402 and the second package 404 may be tested individually to ensure the use known good die/packages before the package-on-package assembly process. The integrated circuit package-on-package system 400 may also undergo further testing during and after assembly.

Although the present embodiment only depicts a first package 402 and a second package 404 stacked thereover, it is to be understood that the integrated circuit package-on-package system 400 includes any number of packages stacked one over the other. Furthermore, the substrate 406 may also serve as a system level heat sink for the integrated circuit package-on-package system 400.

Figure 5:
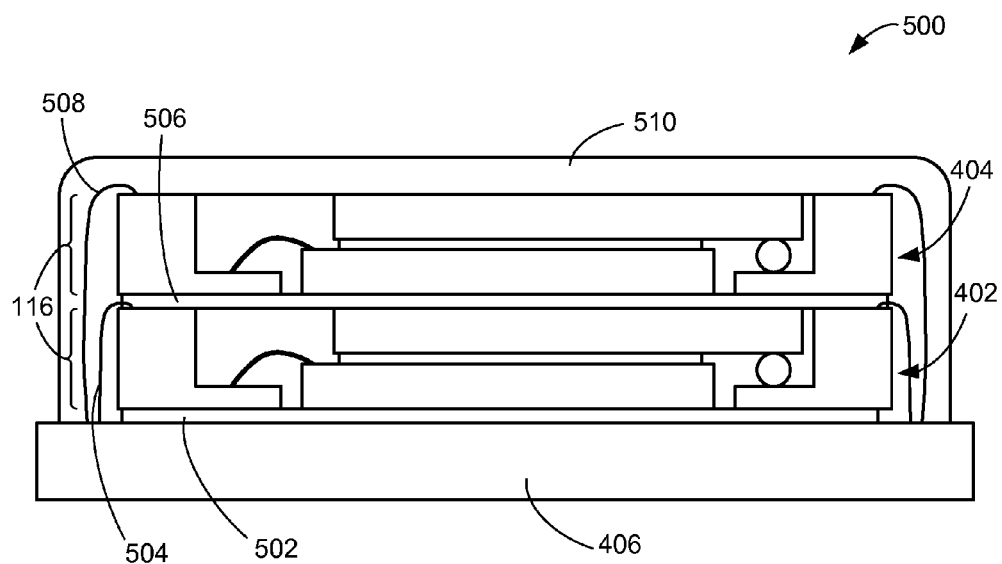
FIG. 5 is a cross-sectional view of an integrated circuit package-in-package system, in accordance with another embodiment of the present invention.

Referring now to FIG. 5, therein is shown a cross-sectional view of an integrated circuit package-in-package system 500, in accordance with another embodiment of the present invention. The integrated circuit package-in-package system 500 includes the first package 402 stacked below the second package 404. The first package 402 and the second package 404 may be similar to or substantially the same as the integrated circuit package system 200, of FIG. 2.

The first package 402 is attached to the substrate 406, such as a printed circuit board, with an adhesive 502, such as a thermal adhesive or a film adhesive. The electrical interconnect system 116 of the first package 402 is connected to the substrate 406 with first interconnects 504, such as bond wires.

The second package 404 stacks over the first package 402 with an inter-package structure 506, such as an adhesive film, a spacer, or an electromagnetic interference shield, in between. The electrical interconnect system 116 of the second package 404 is connected to the substrate 406 with second interconnects 508, such as bond wires.

The encapsulation material 510 covers the first package 402 and the second package 404, the first interconnects 504, the inter-package structure 506 and the second interconnects 508. The encapsulation material 510 may be any number of materials, such as an epoxy molding compound.

The first package 402 and the second package 404 may be tested individually to ensure the use known good die/packages before the package-on-package assembly process. The integrated circuit package-in-package system 500 may also undergo further testing during and after assembly.

Although the present embodiment only depicts a first package 402 and a second package 404 stacked thereover, it is to be understood that the integrated circuit package-in-package system 500 includes any number of packages stacked one over the other. Furthermore, the substrate 406 may also serve as a system level heat sink for the integrated circuit package-in-package system 500.

FIGS. 6-9 depict an exemplary process flow for the manufacture of the integrated circuit package system 200 in accordance with an embodiment of the present invention. It is to be understood that FIGS. 6-9 depict by way of example and not by limitation, an exemplary process flow for the formation of the integrated circuit package system 200, and it is not to be construed as limiting.

Figure 6:
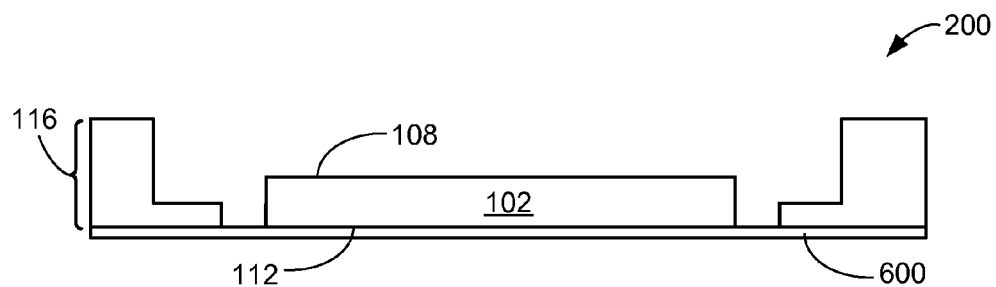
FIG. 6 is a cross-sectional view of an integrated circuit package system, of FIG. 2, in an initial stage of manufacture in accordance with an embodiment of the present invention.

Referring now to FIG. 6, therein is shown a cross-sectional view of the integrated circuit package system 200, of FIG. 2, in an initial stage of manufacture in accordance with an embodiment of the present invention. This cross-sectional view depicts attaching the first device backside 112 of the first device 102 and the electrical interconnect system 116 to a support medium 600, such as a coverlay tape. The electrical interconnect system 116 may be formed by a number of processes, such as deep etching of a portion of the electrical interconnect system 116, resulting in the L-shape configuration. The surface of the electrical interconnect system 116 attached to the support medium 600 is substantially coplanar with the first device backside 112. The first device active side 108 is left exposed for further processing steps. The support medium 600 helps to maintain the structural integrity of the integrated circuit package system 200 during processing. This stage can be generally referred to as first die attach.

Figure 7:
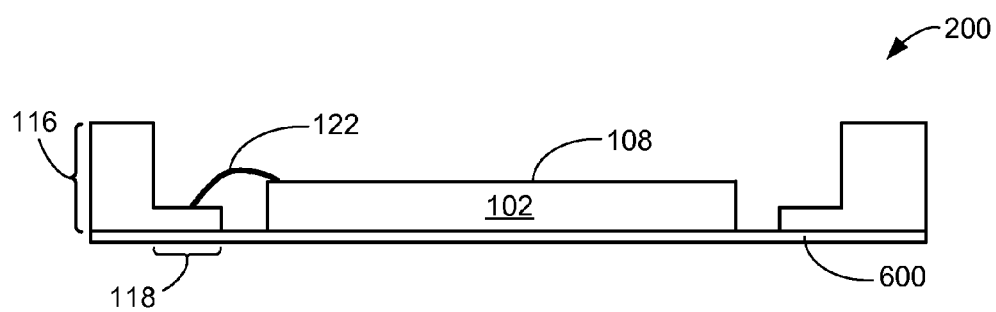
FIG. 7 is the structure of FIG. 6 after formation of a wire bond.

Referring now to FIG. 7, therein is shown the structure of FIG. 6 after formation of the wire bond 122. The wire bond 122 electrically connects the first device active side 108 of the first device 102 and the first lead-finger system 118 of the electrical interconnect system 116. This stage can generally be referred to as the first die wire bonding.

Figure 8:
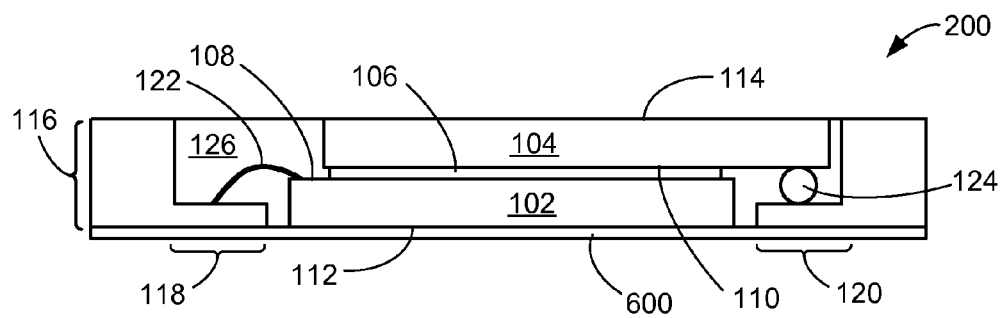
FIG. 8 is the structure of FIG. 7 after attachment of a second device over a first device.

Referring now to FIG. 8, therein is shown the structure of FIG. 7 after attachment of the second device 104 over the first device 102. This embodiment depicts the second device 104 formed over the first device 102 in an offset fashion with the first device active side 108 and the second device active side 110 separated by the inter-device structure 106. The offset configuration of the second device 104 and the first device 102 exposes the bonding pads located on the first device active side 108 and the second device active side 110.

By offsetting the second device 104, the bonding pads located on the second device active side 110 now overhang the second lead-finger system 120, which allows the second device 104 to be electrically connected to the second lead-finger system 120 by the bump bond 124. The bump bond 124 reduces the footprint area of the integrated circuit package system 200 by eliminating the minimum distance requirement of a wire bonding interconnection step.

After the bump bond 124 is formed, the first device 102, the second device 104, the inter-device structure 106, the first lead-finger system 118, the second lead-finger system 120, the wire bond 122 and the bump bond 124 are covered by the encapsulating material 126. This molding process can be designed such that the encapsulation material 126 does not cover the first device backside 112 and the second device backside 114. The support structure 600 stabilizes the integrated circuit package system 200 during these process steps. Generally, this stage can be referred to as the second die attach and mold phase.

Figure 9:
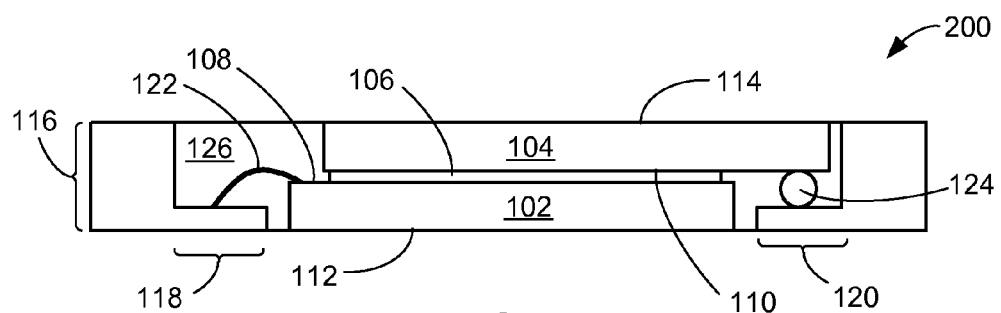
FIG. 9 is the structure of FIG. 8 after removal of the support structure, of FIG. 8, and a post mold cure.

Referring now to FIG. 9, therein is shown the structure of FIG. 8 after removal of the support structure 600, of FIG. 8, and a post mold cure. The integrated circuit package system 200 includes the first device 102, the second device 104, the inter-device structure 106, the first device active side 108, the second device active side 110, the first device backside 112, the second device backside 114, the electrical interconnect system 116, the first lead-finger system 118, the second lead-finger system 120, the wire bond 122, the bump bond 124, and the encapsulation material 126. During this portion of the manufacturing sequence, the support structure 600 is removed from the integrated circuit package system 200, thereby exposing the first device backside 112 and the bottom surface of the electrical interconnect system 116. Additionally, a post mold cure is performed to strengthen the encapsulation material 126. If desired, the structure of FIG. 9 may undergo an optional plating process for improved conductivity and bonding.

The structure of FIG. 9 is then singulated from the electrical interconnect system 116 along tie bar removal lines (not shown). After singulation, the integrated circuit package system 200 will exhibit or possess the characteristics of singulation along its peripheral edges. The characteristics of singulation may include physical features, such as micro-abrasions, which are indicative of a lasing or mechanical dicing process.

Generally, this stage can be referred to as tape removal and singulation.

Figure 10:
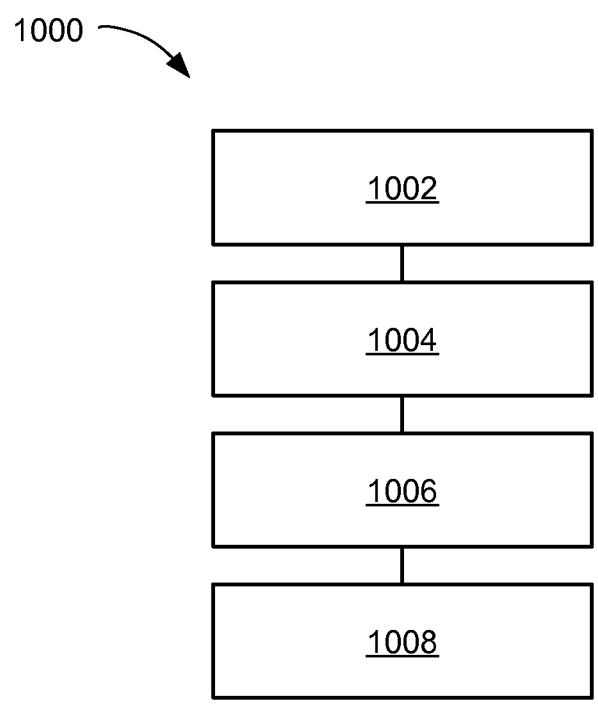
FIG. 10 is a flow chart of an integrated circuit package system for an integrated circuit package system in accordance with an embodiment of the present invention.

Referring now to FIG. 10, therein is shown a flow chart of an integrated circuit package system 1000 for the integrated circuit package system 100 and 200 in accordance with an embodiment of the present invention. The integrated circuit package system 1000 includes providing an electrical interconnect system including a first lead-finger system and a second lead-finger system in a block 1002; connecting a first device to the first lead-finger system with a wire bond in a block 1004; stacking a second device over the first device in a block 1006; and connecting the second device to the second lead-finger system with a bump bond in a block 1008.

As a matter of convenience, both the apparatus and method of embodiments of the present invention have been described by the term "integrated circuit package system", but which system is being referred to may easily be determined by context.

It has been discovered that the present invention thus has numerous aspects. A principle aspect is that the present invention provides an integrated circuit package system possessing a reduced footprint area. By employing a combination of wire bond and bump bond technology, the present invention is able to reduce the footprint area of a device.

Another aspect of the present invention is that it provides a package design with enhanced thermal dissipation characteristics. By exposing the backside of each device to the external environment, the integrated circuit package system may more readily dissipate any heat generated by the devices within the package.

Another aspect of the present invention is that it provides a package design with a low height. By eliminating the use of a die paddle and by employing thin and ultra-thin devices, the height of the package can be reduced.

Another aspect of the present invention is that it provides an offset active side-to-active side stacking configuration that protects the circuitry of the active sides.

Yet another aspect of the present invention is that it provides the flexibility of stacking in different configurations, such as package-on-package and package-in-package configurations.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for enhancing thermal performance and for reducing package footprint area. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. An integrated circuit package system comprising:
providing an electrical interconnect system including a first lead-finger system and a second lead-finger system;
mounting a first device having a first device active side and a first device backside side coplanar with a side of the first lead-finger system;
attaching a wire bond to the first device active side and the first lead-finger system;
stacking a second device over the first device; and
connecting the second device to the second lead-finger system with a bump bond.

2. The system as claimed in claim 1 wherein:
providing the electrical interconnect system further includes providing a stacking support system attached to the first lead-finger system and the second lead-finger system for package stacking.

3. The system as claimed in claim 1 wherein:
stacking the second device includes offsetting the second device to expose a portion of the first device active side and a second device active side.

4. The system as claimed in claim 1 further comprising:
configuring the integrated circuit package system to expose the first device backside and a second device backside.

5. The system as claimed in claim 1 further comprising:
providing an inter-device structure between the first device and the second device.

* * * * *